United States Patent
Calvert et al.

(10) Patent No.: US 8,013,697 B2
(45) Date of Patent: Sep. 6, 2011

(54) SOLENOIDAL SUPERCONDUCTING MAGNET STRUCTURE

(75) Inventors: Simon James Calvert, Oxon (GB); Jonathan Noys, Oxon (GB); Adrian Mark Thomas, Oxon (GB)

(73) Assignee: Siemens PLC, Frimley, Camberley (GB)

( * ) Notice: Subject to any disclaimer, the term of this patent is extended or adjusted under 35 U.S.C. 154(b) by 0 days.

(21) Appl. No.: 12/357,975

(22) Filed: Jan. 22, 2009

(65) Prior Publication Data

US 2009/0128270 A1 May 21, 2009

Related U.S. Application Data

(62) Division of application No. 11/734,915, filed on Apr. 13, 2007, now Pat. No. 7,849,587.

(30) Foreign Application Priority Data

Apr. 13, 2006 (GB) .................................. 0607463.7

(51) Int. Cl.
*H01F 1/00* (2006.01)
*H01F 7/00* (2006.01)
*H01F 6/00* (2006.01)
*H01F 5/00* (2006.01)
*H01F 7/06* (2006.01)
*G01V 3/00* (2006.01)
*H01L 39/24* (2006.01)

(52) U.S. Cl. ........ 335/216; 335/217; 335/250; 335/282; 335/284; 335/296; 335/299; 324/318; 324/319; 324/320; 29/599; 29/602.1; 29/605; 29/606

(58) Field of Classification Search .................. 335/216, 335/217, 250, 282, 284, 296, 299, 300; 324/300, 324/307, 309, 318, 319, 320, 322; 29/599, 29/602.1, 605, 606, 846, 847, 856, 858, 883; 427/96, 97, 116, 123, 124

See application file for complete search history.

(56) References Cited

U.S. PATENT DOCUMENTS

| | | | |
|---|---|---|---|
| 4,385,248 A * | 5/1983 | Laskaris | 310/52 |
| 4,660,013 A * | 4/1987 | Laskaris et al. | 335/299 |
| 4,924,198 A | 5/1990 | Laskaris | |
| 4,935,714 A * | 6/1990 | Vermilyea | 505/211 |
| 5,023,584 A | 6/1991 | Laskaris | |
| 5,045,826 A * | 9/1991 | Laskaris | 335/301 |
| 5,235,283 A | 8/1993 | Lehne et al. | |
| 5,278,502 A | 1/1994 | Laskaris et al. | |
| 5,280,247 A * | 1/1994 | DeMeester et al. | 324/318 |
| 5,332,972 A | 7/1994 | Takenouchi | |
| 5,409,558 A | 4/1995 | Takahasi et al. | |
| 5,489,848 A * | 2/1996 | Furukawa | 324/318 |
| 5,668,516 A | 9/1997 | Xu et al. | |
| 5,917,393 A | 6/1999 | Kupiszewski et al. | |
| 6,011,394 A * | 1/2000 | Petropoulos et al. | 324/318 |

(Continued)

FOREIGN PATENT DOCUMENTS

CN 1268756 10/2000

*Primary Examiner* — Anh T Mai
*Assistant Examiner* — Mohamad A Musleh
(74) *Attorney, Agent, or Firm* — Schiff Hardin LLP

(57) ABSTRACT

A method of manufacturing a solenoidal magnet structure, includes the step of providing a collapsible accurate mold in which to wind the coils winding wire into defined positions in the mold, placing a mechanical support structure over the coils so wound, impregnating the coils and the mechanical support structure with a thermosetting resin, allowing the thermosetting resin to harden, and collapsing the mold and removing the resultant solenoidal magnet structure formed by the resin impregnated coils and the mechanical support structure from the mold as a single solid piece.

11 Claims, 8 Drawing Sheets

U.S. PATENT DOCUMENTS

| | | | |
|---|---|---|---|
| 6,377,047 B1 * | 4/2002 | Wong et al. | 324/318 |
| 7,053,740 B1 * | 5/2006 | Laskaris et al. | 335/216 |
| 2006/0218942 A1 * | 10/2006 | Atkins et al. | 62/51.1 |
| 2006/0284711 A1 | 12/2006 | Atkins et al. | |
| 2006/0288731 A1 * | 12/2006 | Atkins et al. | 62/457.9 |
| 2007/0120630 A1 * | 5/2007 | Huang et al. | 335/216 |
| 2007/0152785 A1 * | 7/2007 | Calvert et al. | 335/216 |

* cited by examiner

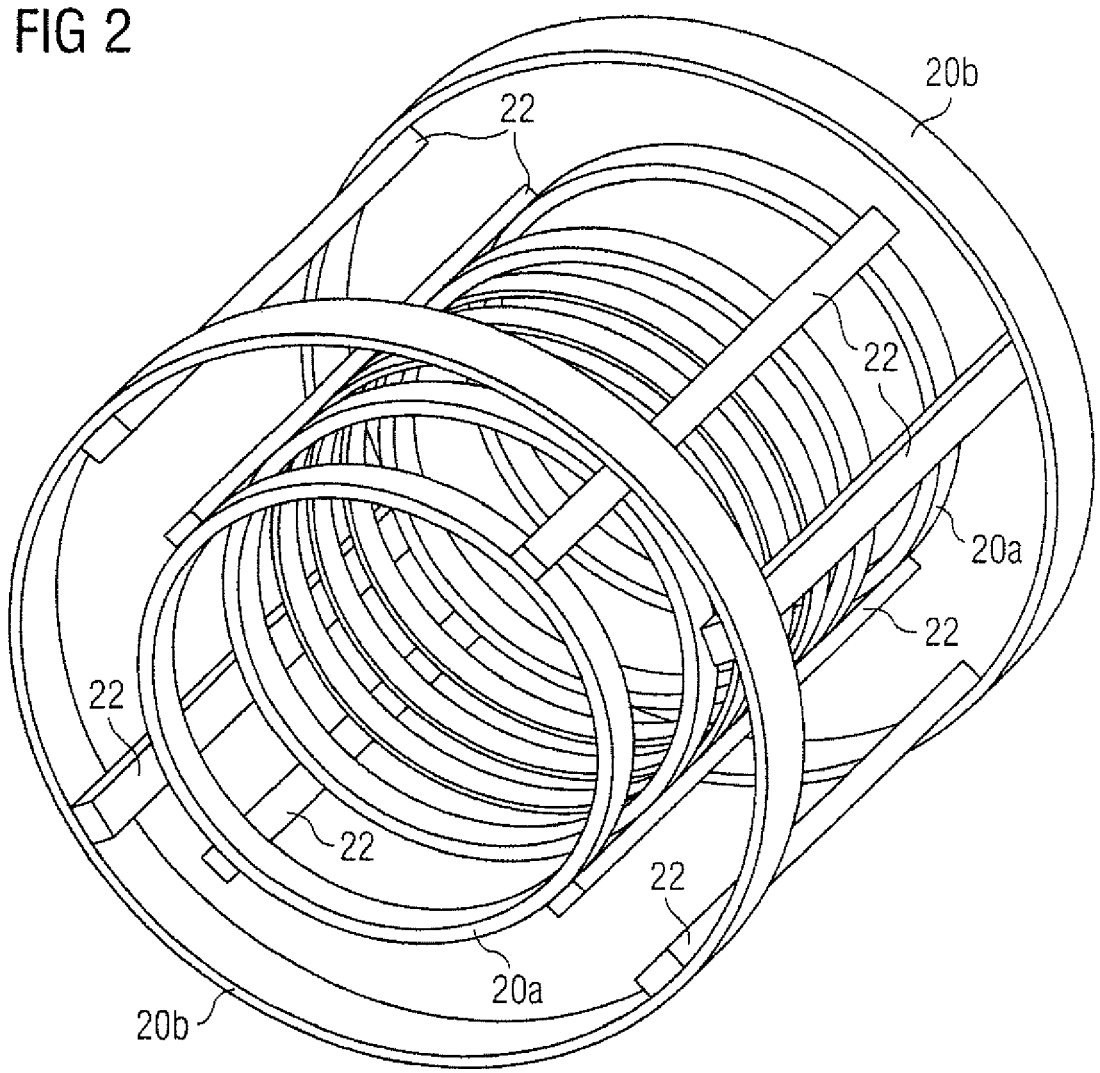

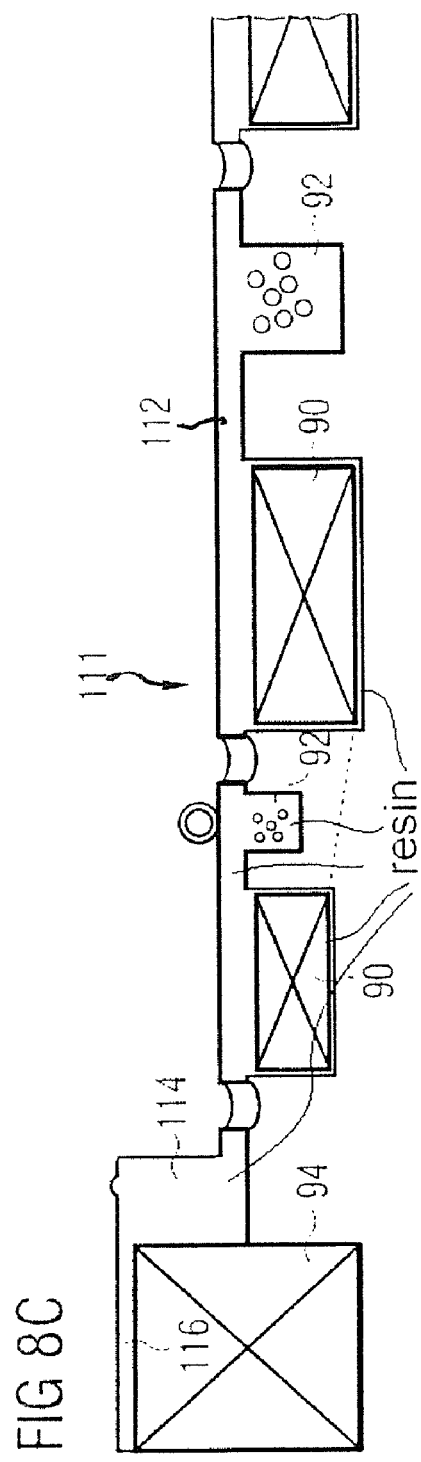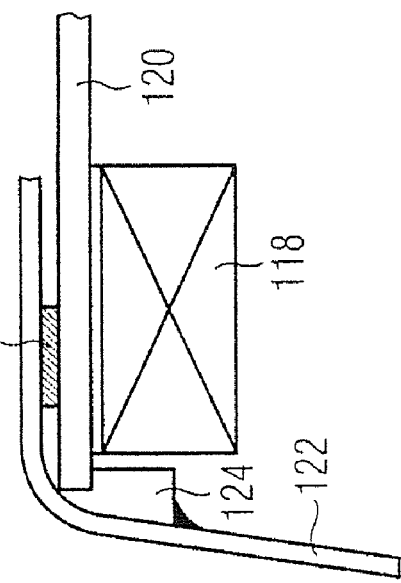

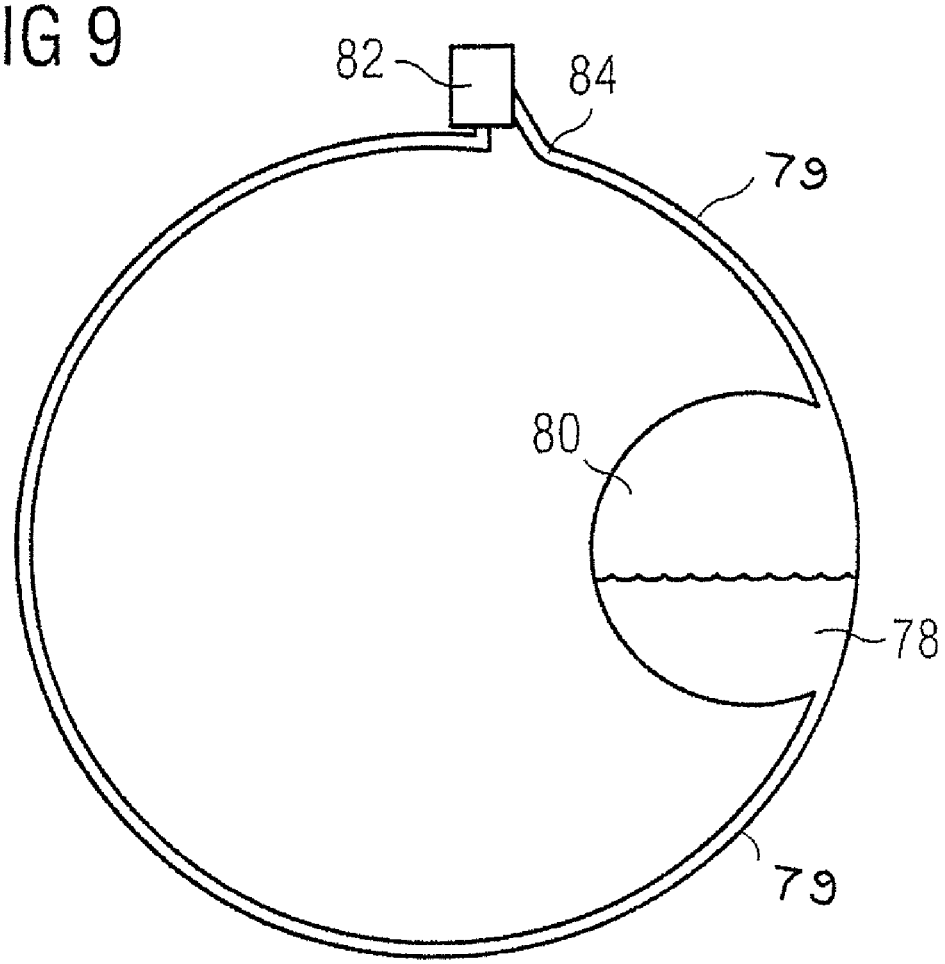

SOLENOIDAL SUPERCONDUCTING MAGNET STRUCTURE

RELATED APPLICATION

The present application is a divisional of application Ser. No. 11/734,915, filed Apr. 13, 2007 now U.S. Pat. No. 7,849,587.

BACKGROUND OF THE INVENTION

1. Field of the Invention

The present invention relates to a method of manufacture of solenoidal magnet coils, and to solenoidal magnet coils themselves. In particular, it relates to such coils for generating high strength magnetic fields, which may be applied in systems such as nuclear magnetic resonance (NMR) or magnetic resonance imaging (MRI).

2. Description of the Prior Art

FIGS. 1A-1B illustrate cross-sectional and axial sectional views, respectively, of a conventional solenoidal magnet arrangement for a nuclear magnetic resonance (NMR) or magnetic resonance imaging (MRI) system. A number of coils of superconducting wire are wound onto a former 1. The resulting assembly is housed inside a cryogen vessel 2 which is at least partly filled with a liquid cryogen 2a at its boiling point. The coils are thereby held at a temperature below their critical point.

The former 1 is typically constructed of aluminum, which is machined to ensure accurate dimensions of the former 1, in turn ensuring accurate size and position of the coils which are wound onto the former. Such accuracy is essential in ensuring the homogeneity and reliability of the resultant magnetic field. Superconducting magnets may quench due to even a small amount of movement of even one turn of the coil. The formers must therefore be very rigid. These requirements combine to render the production of formers very expensive.

Also illustrated in FIGS. 1A-1B are an outer vacuum container 4 and thermal shields 3. As is well known, these serve to thermally isolate the cryogen tank from the surrounding atmosphere. Insulation 5 may be placed inside the space between the outer vacuum container and the thermal shield. However, as can be seen in FIGS. 1A-1B, these elements also reduce the available inside diameter 4a of the solenoidal magnet. Since the inside diameter 4a of the solenoidal magnet is required to be of a certain dimension to allow patient access, the presence of the outer vacuum container 4 and the thermal shields 3 effectively increases the diameter of the magnet coils and the former 1, adding to the cost of the overall arrangement.

The cost of producing a former 1 such as illustrated in FIGS. 1A-1B and described above is accounted for approximately equally by labor costs and material costs. Among other objectives, the present invention seeks to reduce the labor costs involved in producing a solenoidal magnet structure.

U.S. Pat. No. 5,917,393 describes a solenoidal superconducting magnet arrangement wherein the various coils are mounted on an inner or outer surface of a thermally conductive cylindrical former, whereby cooling may be applied through the material of the former. The coils are thermally connected to, but electrically isolated from, the material of the cylindrical former.

SUMMARY OF THE INVENTION

An object of the present invention is to alleviate at least some of the problems of the prior art described above, and to provide a relatively inexpensive and lightweight former which is capable of withstanding the forces applied to it in use, so that the former provides accurate and stable positioning of the coils of the solenoidal magnet.

The above object is achieved in accordance with a first embodiment of the invention by a method for manufacturing a solenoidal magnet structure including the steps of providing a collapsible mold in which to wind the coils, winding wire into predefined positions in the mold, placing a mechanical support structure over the coils that have been wound in the mold, impregnating the coils and the mechanical support structure with a thermosetting resin, allowing the thermosetting resin to harden, and collapsing the mold and removing the resulting solenoidal magnet structure, that includes the resin-impregnated coils and the mechanical structure from the mold, as a single solid piece.

The above object also is achieved in accordance with the present invention in a second embodiment of a method for manufacturing a magnet structure, that includes the steps of providing a collapsible mold in which to wind the coils, placing a mechanical support structure into defined positions in the mold, winding the wire over the mechanical support structure that has been placed in the mold, impregnating the coils and the mechanical support structure with a thermosetting resin, allowing the thermosetting resin to harden, and collapsing the mold and removing the resulting solenoidal magnet structure, including the resin-impregnated coils and the mechanical support structure, from the mold as a single solid piece.

The object also is achieved in accordance with the present invention by a solenoidal magnet structure having a wire wound into coils, and a magnetic support structure located over the wound coils, with the entirety of the coils and the mechanical support structure being monolithically impregnated with a thermosetting resin.

The above object also is achieved in accordance with the present invention by a solenoidal magnet structure having a magnet support structure, and a wire wound into coils over the mechanical support structure, with the entirety of the magnetic support structure and the coils being monolithically impregnated with a thermosetting resin.

DESCRIPTION OF THE DRAWINGS

FIG. 2 shows an overall perspective view of an assembly of coils and staves according to an embodiment of the present invention.

FIGS. 8A-8D show steps in a method for producing an inner former for the GRP concept.

FIG. 9 shows a cooling loop refrigeration arrangement.

DESCRIPTION OF THE PREFERRED EMBODIMENTS

FIG. 2 shows an overall perspective view of an assembly of coils 20 and staves 22 according to an embodiment of the present invention. The coils are divided into inner coils 20*a* and outer coils 20*b*.

Figure 3:
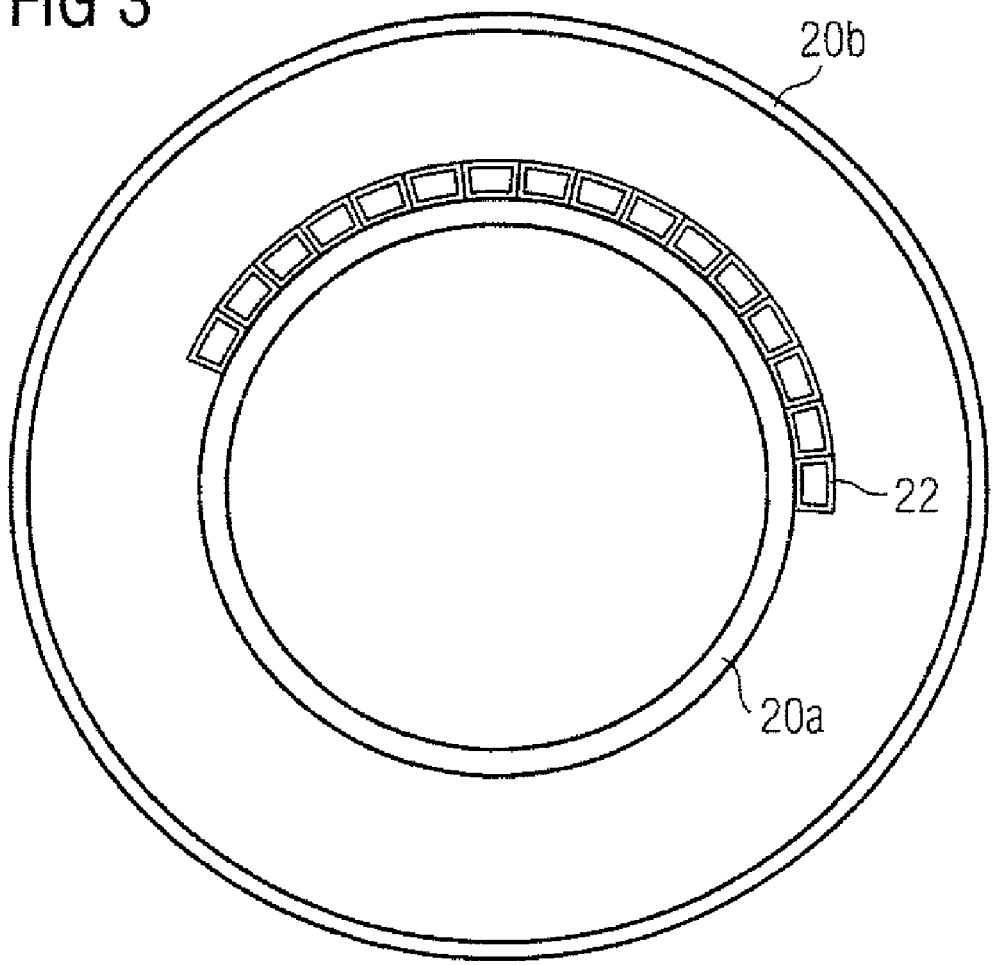
FIG. 3 shows an axial view of an assembly of coils and staves according to an embodiment of the present invention.

FIG. 3 shows an axial view of an assembly of coils 20 and staves 22 according to an embodiment of the present invention. In FIG. 3, staves 22 are shown only partially surrounding the inner coils 20*a*. However, it should be understood that the staves are present around the entire perimeter of the inner coils 20*a* in the embodiment illustrated. The staves 22 need not be contiguous around the entire perimeter of the coils 20*a*, as illustrated, but may be symmetrically spaced at intervals. However, the staves 22 should be sufficient in number and strength to ensure that the coils 20 are accurately and rigidly positioned, sufficiently to withstand the forces placed on the coils.

Figure 4:
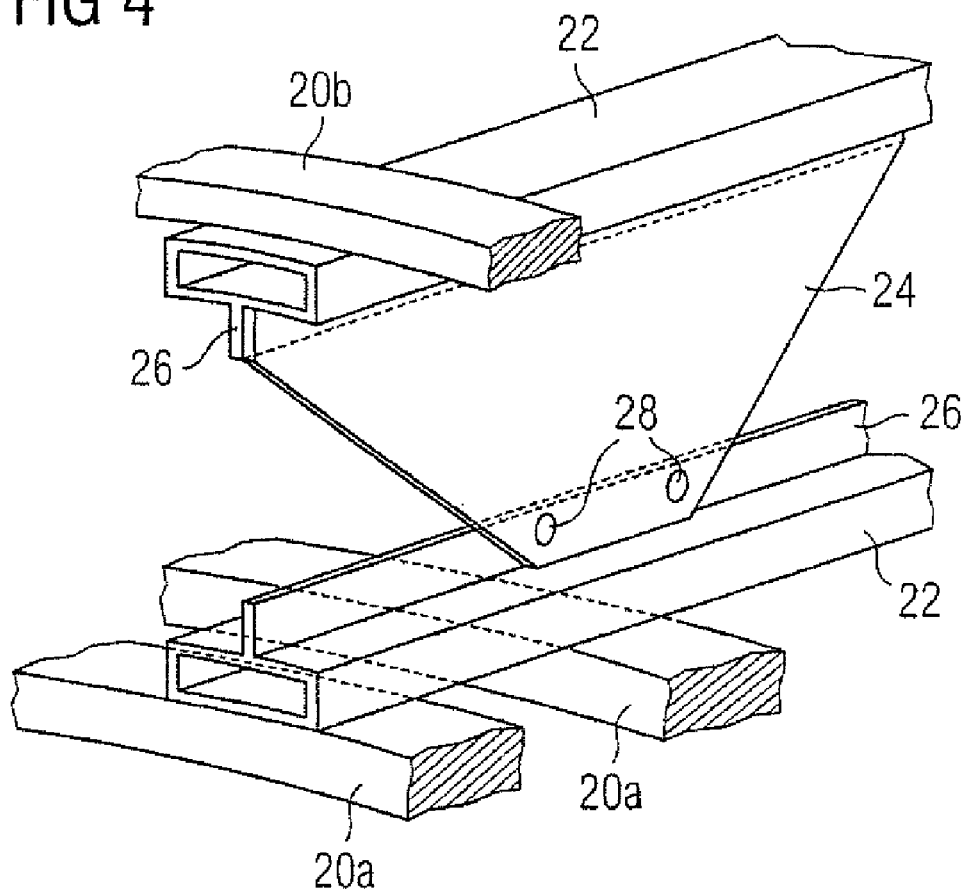
FIG. 4 shows an arrangement for retaining outer coils coaxially with inner coils.

Outer coils 20*b* are retained in a coaxial alignment with inner coils 20*a*. FIG. 4 illustrates one example arrangement for achieving this. Inner coils 20*a* are retained in their correct relative position by staves 22. Outer coils 20*b* are similarly held in their correct relative positions by staves 22. In order to minimize the overall dimension of the solenoidal magnet assembly, the staves 22 may be placed on the outer circumference of the inner coils 20*a* and on the inner circumference of the outer coils 20*b*. However, the staves 22 may be placed on the outer or inner circumference of any of the coils, as may be preferred for any reason. In order to retain the inner and outer coils in the required relative positions, webs 24 are connected between corresponding staves 22 of the inner and outer sets of coils. As shown in FIG. 4, these webs 24 may take the form of plates of solid material such as aluminum or glass reinforced plastic (GRP) attached between the staves 22. To facilitate attachment of such webs, the staves 22 may be manufactured with fixing lugs 26. Fixing holes may then be drilled through the fixing lugs at appropriate points, and the webs attached by bolts or similar fastening means 28 passing through the fixing lugs. Alternatively, mechanical clamps may be provided and arranged to clamp the webs 24 to the fixing lugs 26. Mechanical clamps may alternatively be provided to clamp the webs 24 directly to the body of the staves 22, obviating the necessity for fixing lugs 26.

Figure 1A:
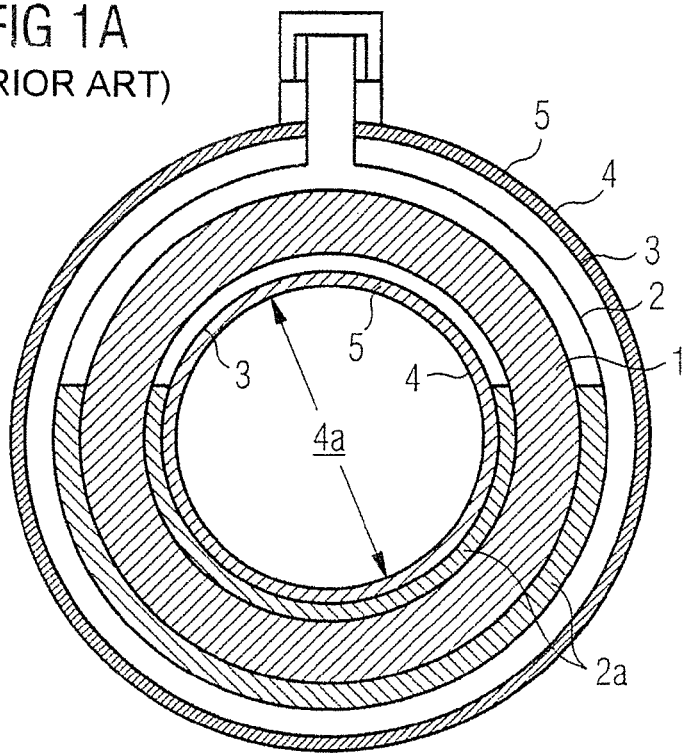
FIGS. 1A-1B show a solenoidal magnet structure housed within a cryostat, according to the prior art.
Figure 1B:
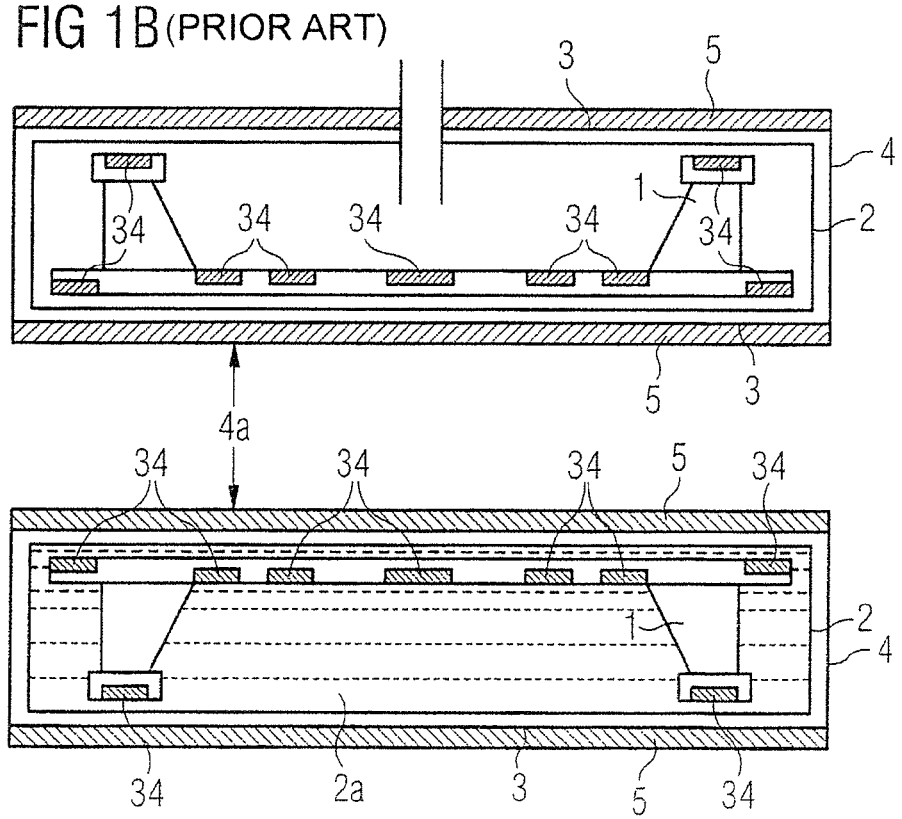

As illustrated in FIG. 2, a solenoidal magnet according to the present invention may be arranged such that the inner coils 20*a* may be of lesser diameter than in the case of a prior art arrangement such as shown in FIGS. 1A-1B. This is because the prior art arrangement of FIGS. 1A-1B relies on compressive strength of the former 1 to support the coils in operation. As a result of this, the former 1 must be present within the inner diameter of the inner coils, which has either the effect of reducing the inner diameter 4*a* available for accommodating a patient, or increasing the dimension of the inner coils, in turn increasing the cost of the coils and so also the magnet assembly as a whole.

Solenoidal magnet structures according to the present invention may be cooled by immersion in a cryogen vessel, similarly to the prior art arrangement illustrated in FIGS. 1A-1B. Alternatively, cooling may be effected by providing hollow staves 22, and causing a cryogen to circulate within the staves. In such embodiments, the coils 20 must be in effective thermal contact with the cooled staves 22, and the whole should be adequately isolated from ambient temperature to allow the superconducting switches and other components requiring an isothermal surface could be mounted on the staves. By providing cooling through the staves, then it is no longer necessary to provide a cryogen vessel such as illustrated at 2 in FIGS. 1A-1B. This will further reduce the size, weight and cost of the resulting system.

Figure 5:
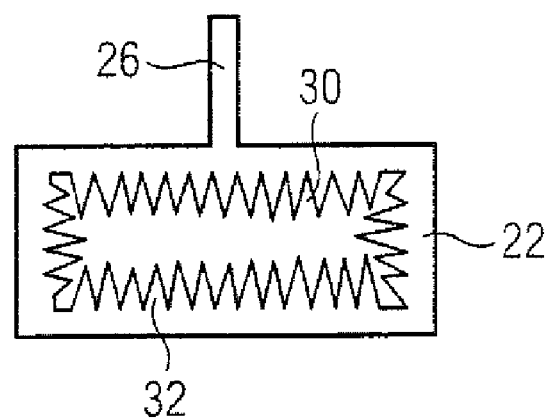
FIG. 5 shows a cross-section through a stave which has a cooling channel passing therethrough.

FIG. 5 illustrates a cross-section through a stave 22 which is particularly suitable in such embodiments. The stave 22 is hollow with a cooling channel 30 passing through it. Advantageously, the inner surface of the cooling channel includes ribs 32 that increase the inner surface area of the cooling channel in contact with the cooling fluid, thereby increasing the effectiveness of the cooling of the stave. Shield coil supports and other supports may be extruded into the profile of the staves.

According to further embodiments of the invention, arrangements may be made to cool the staves 22, while thermal conduction along the material of the staves causes cooling of the coils. In such embodiments, the staves may be cooled by direct refrigeration, or by a cooling loop. FIG. 9 schematically illustrates a cooling loop arrangement for causing the liquid cryogen 78 to circulate around the cryogen tubes 79. A relatively small cryogen tank 80 is provided in the cryogen tube circuit. A recondensing refrigerator 82 is also provided. In operation, some of the liquid cryogen 78 in cryogen tube 79 will absorb heat from the cryogen tube 79, and thus from the staves 22. This will cause some of the liquid cryogen 78 to boil into a gaseous state. The boiled-off cryogen gas 84 will rise toward the top of the cryogen tube circuit, and will enter the recondensing refrigerator 82. The recondensing refrigerator 82 operates to cool the cryogen gas 84, recondensing it into liquid cryogen 78, and removing heat from the system. As illustrated in FIG. 9, boiling of the liquid cryogen will take place substantially on the right side of the circuit as illustrated, and will rise to the recondensing refrigerator 82. The recondensed liquid cryogen supplied by refrigerator 82 will descend through the left hand side of tube 79, as illustrated. Hence, this arrangement provides continuous circulation of the cryogen, and effective cooling. Although a cryogen tank 80 is required, the volume of liquid cryogen 78 required is very much reduced as compared to cryogen tanks 2 of the prior art, which allowed immersion of the magnet in a bath of liquid cryogen.

An advantage of the arrangement of the present invention is that the frictional interface 34 between coils and former, illustrated at in FIGS. 1A-1B, is eliminated. This frictional interface may provoke quench in prior art arrangements, since movement of a coil in frictional contact with the former may cause sufficient localized heating to bring about a quench. Since there are no such frictional interfaces in the arrangement of the present invention, such risks are not present. The body force, that is the electromagnetic force acting on the coils, is restrained by the shear bond strength between the coils and the staves or other mechanical support structure. The coils are manufactured and retained by a mechanical support structure according to any of the methods described elsewhere within the present application, and such manner of manufacture provides the required body strength without the need for formers. The interfacial shear strength required between the coils and the staves to maintain their position when subjected to the electromagnetic loads is −3 Mpa, typically 10% of the shear strength achieved by the bonding method within the coils to prevent movement of individual turns, and is therefore within the capability of existing technology.

Patient comfort and accessibility of clinicians in MRI systems may both be improved by reducing the length of the magnet. Coil arrangements which permit this length reduction, while maintaining field quality may result in coil body forces which act in an axial direction away from the center of the magnet. Conventional methods of restraining these forces require additional former material to be positioned on the end of the coil increasing the length of the magnet system. By utilizing the shear strength at the interface between the coils and staves or other mechanical support structure, such additional material can be avoided and a shorter magnet system length achieved.

The present invention particularly provides a method of manufacturing a solenoidal magnet structure. An embodiment of the present invention will now be discussed.

Figure 6:
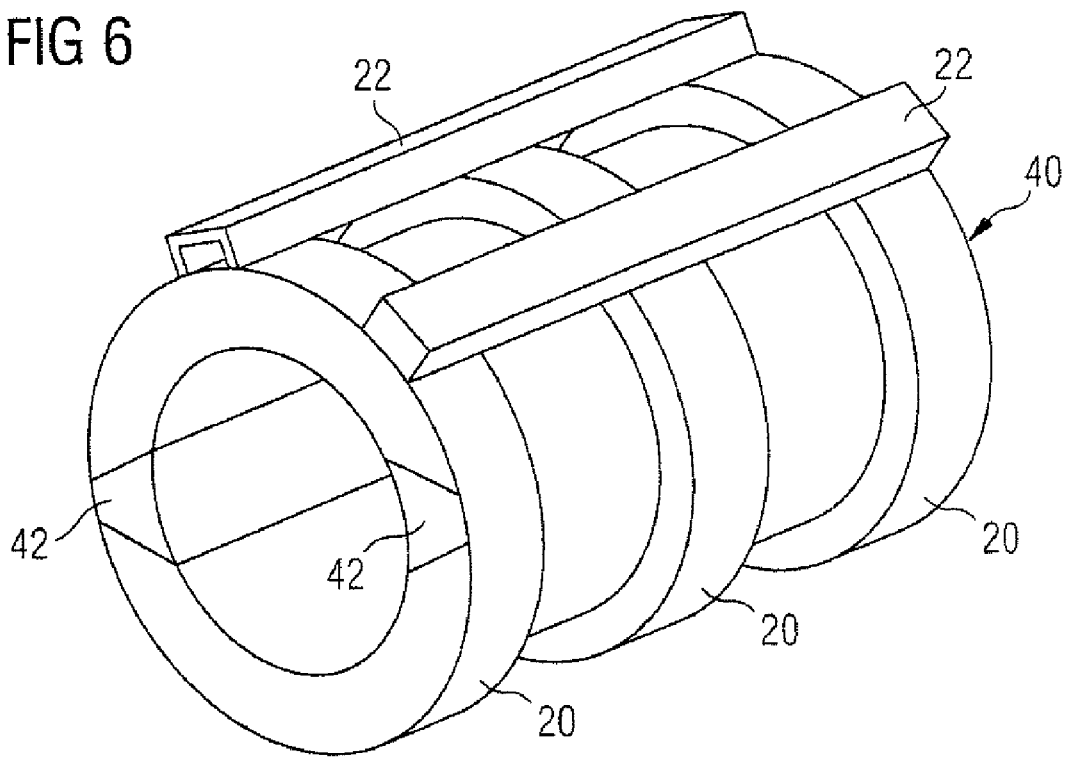
FIG. 6 illustrates a mold suitable for mold impregnated coils according to an embodiment of the present invention.

Firstly, an accurate mold is required in which to wind the coils. Because no former is to be provided, the accurate dimensions and relative spacing of the coils are defined by this mold, which must accordingly be very accurately made, and of a durable material, to allow a single mold to be used to produce many magnet structures. The mold is arranged to be collapsible. Superconducting wire is wound into defined positions in the mold. Typically, these positions will be recesses in the surface of the mold. A mechanical support structure, such as staves 22 may be placed over the coils so wound or a composite tube of reinforced resin may be formed over the coils so wound, by winding reinforcing material over the coils then resin impregnating as discussed below. A further mold may be placed over the coils and the mechanical support structure to form an enclosed mold cavity. The coils and the mechanical support structure within the mold are monolithically impregnated with a thermosetting resin. This is allowed to harden and the resin impregnated coils and mechanical support structure are moved from the mold as a single solid piece. The impregnation step is preferably performed in a vacuum, to avoid bubbles of air or other gas which might otherwise be trapped in the winding and cause stresses in the finished piece. FIG. 6 illustrates a suitable mold 40, in more detail. The mold may be provided with a lining, such as in polytetrafluoroethylene PTFE, to aid in releasing the finished articles.

A particular advantage of this method of forming the solenoidal coil arrangement is in that the coils are accurately dimensioned and positioned relative to each other by the shape of the mold. The mechanical support structure that is formed onto the coils does not itself need to be accurately dimensioned, since the positioning of the coils is defined by the mold, and the mechanical support structure merely serves to securely retain the coils in their relative positions as defined by the mold.

This is particularly advantageous since the mold, which must be very accurately dimensioned, and is relatively expensive, may be re-used several times to produce a number of similar solenoidal magnet structures. Conventionally, the mechanical support means itself has been the accurately dimensioned, expensive component. Use of the method of the present invention, using an accurately machined mold to define the dimensions and relative positions of the coils, accordingly allows production of accurate solenoidal magnet structures for a reduced cost, and in reduced time, as compared to existing methods of production.

In producing solenoidal magnets having inner field coils 20a (FIG. 2) and outer shield coils 20b, the relative position of the shield coils to each other, and the relative position of the field coils to each other, is more critical than the relative position of the shield coils to the field coils. The field coils and the shield coils may each be produced, and mounted on a mechanical support structure, by the method described above.

FIG. 4 shows a mechanical support structure which may be employed to retain a shield coil 20b assembly relative to a field coil 20a assembly. The staves 22 may each have a fixing lug 26 (shown in FIG. 4) provided for this purpose, which is drilled to provide holes for fixing bolts. Alternatively, the holes and bolts may pass through the body of the stave 22 itself.

According to an embodiment of the present invention, the staves 22 are positioned in contact with the coils 20 in a mold prior to the impregnation step when thermosetting resin is applied to monolithically embed the whole assembly to produce a single solid article. Typically vacuum impregnation is used. The coils 20 may be attached to staves 22 by cloth impregnated with the thermosetting resin. Again, the molds may be provided with a lining, such as in polytetrafluoroethylene PTFE, to aid in releasing the finished articles.

In some alternative embodiments, a wet lay-up process may be employed, where the resin is applied as a coating on the coil conductor, and as part of the mechanical support structure, either as a coating on staves or as an impregnated cloth or similar material.

The staves 22 may be conveniently manufactured as aluminum extrusions, which are relatively inexpensive yet mechanically rigid and thermally conductive enough for the purposes of the present invention. Alternatively, the staves may be formed from rolled and welded tubes, or filament-wound tubes.

Figure 3A:
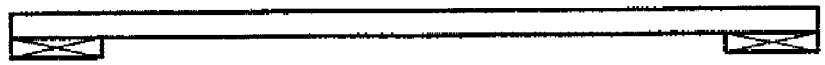
FIGS. 3A and 3B show a straight stave and a shaped stave, respectively for use in accordance with the invention.
Figure 3B:
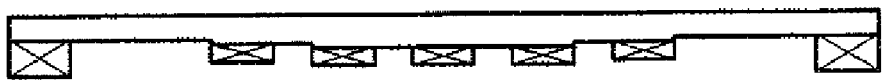

Typically in solenoidal magnet structures, some coils will be of different internal or external diameter from others. In this case, it may be necessary to bring all coils to a common diameter to enable them all to be attached to straight staves. The alternative is to provide shaped staves which correspond to the various diameters of the coils. This option is however presently considered to be uneconomical. FIGS. 3A-3B illustrate straight and shaped staves, respectively, useful in this application. Differences in the relevant diameters of the coils may be corrected by use of a filler layer of resin-impregnated cloth over-wrap, typically employing glass fiber over-wrap. This may be added while the coil is in a mold, being added either as resin impregnated cloth or dry cloth to be impregnated in the mold.

The coils 20 are wound within corresponding parts of the mold, according to the method described above. In the mold, a filler material such as resin impregnated glass fiber may be wound over coils in order to fill the mold to the top. For example, such filler material may be provided to a depth of 5-10 mm. As illustrated in FIG. 6, the mold may be a collapsible mandrel having at least one removable section 42, allowing the mold to be disassembled and removed from the interior of the molded coils 20.

The use of relatively inaccurate mechanical support structure for the coils, being staves of aluminum extrusions or tubes, and molded resin is rendered possible by use of accurate tooling. All of the important relative positions of features of the solenoidal structure are defined by the molds or other assembly tooling, resulting in a relatively low unit cost of the solenoidal magnet arrangements produced, while the relatively expensive molds and tooling may be re-used a number of times to produce several solenoidal magnet coil assemblies.

The final structure may be further strengthened to prevent any significant deformation of the staves used.

If refrigeration by cooling loop is employed, then the interposition of glass filler layers between the coils and the cooling loop, which may for example be incorporated within the staves, should be avoided. This may be achieved by use of shaped staves such as shown in FIG. 3B, or the solenoidal coil structure would need to be redesigned to avoid the need for coils of differing external diameter. While staves may be employed for the purposes of cooling and mechanical support, is has been found that twelve or more staves should be provided for mechanical support, while as few as six staves may prove sufficient for cooling purposes.

In certain preferred embodiments, mechanical supports may be added on the end coils of an assembly. The end coils suffer the highest mechanical load due to the effects of the generated magnetic field. Such supports may be in the form of rolled extrusions or a resin impregnated glass support ring. These supports may be clamped onto the shield coils.

While the general tendency is to design solenoidal magnets to be as short as possible, a limit may be reached where the end coils are under repulsive force, tending to push them away from the body of the magnet. In such cases, mechanical retaining means may be required on the outer surfaces of the coils, which at least partly defeats the length reduction obtained by placing the end coils in their position.

The assembly formed by the outer shield coils and their support staves may be assembled in the following manner, as illustrated in the cross-section shown in FIG. 7. A former 50 is provided having cavities 52 to accommodate at least part of the length of staves 22. The staves 22 are placed in the cavities 52 in the former 50, and the coils 20b are wound onto the former 50, over the staves 22. The coils 20b are impregnated and the coils are bonded to the staves in a single process in the manner described for other coils. Struts or webs may be provided to mechanically retain the two assemblies together: the first assembly including field coils held together by staves, and shield coils held together by another set of staves. A suitable arrangement is discussed above with reference to FIG. 4. In certain embodiments, the staves may be formed of a reinforcing material, such as glass fiber cloth, which is impregnated with resin during the described method, to provide reinforced resin staves.

Figure 8A:
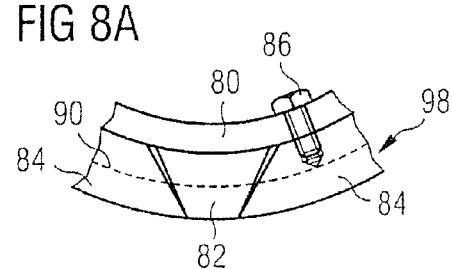
Figure 8B:
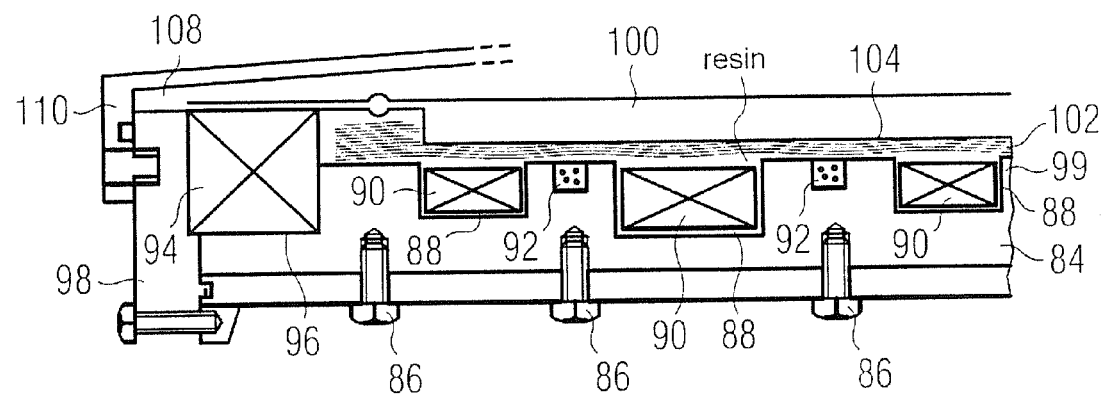

FIGS. 8A-8D illustrate several views of steps in a method of manufacturing a solenoidal magnet structure according to the present invention, wherein the mechanical support structure consists of a reinforced resin tube 102. FIGS. 8A and 8B show a partial end-view and a partial axial cross-section, respectively, of a mold filled with coils and support structure, during the manufacture of a solenoidal magnet coil assembly according to the present invention, having a reinforced resin tube mechanical support structure 102. The mold includes an inner tube member 80 which retains tool segments 82, 84. The tube 80 may be a complete cylindrical tube, or may be divided into segments. In use, the tube 80 and tool segments 82, 84 are retained together by detachable mechanical retaining means, such as the bolts 86 illustrated, to form a generally cylindrical inner surface of the mold.

As shown in FIG. 8B, the tool segments have cavities 88 for retaining coils 90 as they are wound onto the mold, and cavities 92 for retaining electrical leads and other service components. Special arrangements may be made for accommodating the end coils 94. As illustrated, a step 96 may be cut into the end of the tool segments 82, 84, and a flat tool end piece 98 attached to the end of the tube 80 to enclose a cavity to hold end coil 94 as it is wound. A sleeve of filler material 104 is fitted after winding of the inner coil set and to provide support for the winding of the end coils.

Over the top of coils 90 and leads and service components 92, a filler material 104 is laid. This filler material 104 is typically glass fiber cloth, but may be other types of filler compatible with the resin used and which has an acceptable thermal coefficient of expansion. A mold outer 100 is provided to surround the tool segments and to define the mold cavity 99 with the tool segments 82, 84 and end pieces 98, if any. While the tool segments 82, 84 must be accurately formed and accurately positioned, it is not necessary to apply such a degree of accuracy to the position and shape of the mold outer 100.

As illustrated in FIG. 8B, the mold cavity 99 is defined by the tool segments 82, 84 and the mold outer 100 and end pieces 98, if any. The mold cavity is open in certain locations 108, e.g. at its ends. Openings may also be provided through the mold outer. An impregnation trough 110 is affixed around the mold structure, and an impregnation resin is forced through the openings 108 from the impregnation trough into the mold, to monolithically impregnate the coils 90, leads and service components 92, and filler material 104, to produce a single solid article, being the solenoidal magnet structure comprising coils and the mechanical support structure. Once the assembly has been fully impregnated and the resin has set, the various pieces of the mold 82, 84, 98, 100 are moved away from the resultant molded structure. Firstly, the impregnation trough 108 and end pieces 98 should be removed from the mold. The mold outer 100 may also be removed at this stage, or may be removed later. Typically, and with reference to FIGS. 8A, 8B, the tube 80 is detached from the tool segments. If the tube 80 is in a single piece, it can be slid out from the central bore of the assembly. If the tube 80 is split into segments, these segments may be dismantled and removed from the bore. The tool segments 82, 84 are then removed from the molded article. In the example shown in FIG. 8A, the tool segment 82 is tapered to narrow away from the bore of the mold. Such segments should be removed first, to provide clearance for removal of the remaining tool segments 84.

FIG. 8C shows an example of a solenoidal coil assembly 111 produced according to the method described above. The coils 90 are impregnated with resin and have dimensions defined by the accurate surfaces of the tool segments 82, 84. They are bonded by the impregnated resin to a mechanical support structure 112 composed of the impregnated resin filled with filler material. The shear strength of the mechanical bond between coils and staves provided by the impregnated resin is equally effective in both directions. The coils are accordingly rigidly held in accurate relative positions by the mechanical support structure. The end coil 94 is retained by a rather different structure. A thicker filler layer 114 is provided, adjacent to the end coil and bonded to it by the impregnated resin. A further filler layer 116 is provided over the external circumference of the end coil, bonded to the end coil by the impregnated resin.

FIG. 8D shows a partial cross-section of a shield coil arrangement according to an embodiment of the present invention. A shield coil 118 is impregnated with resin, and bonded by that resin to a mechanical support structure 120. The structure is shown mounted inside a vessel 122 provided with a locating element 124.

Figure 7:
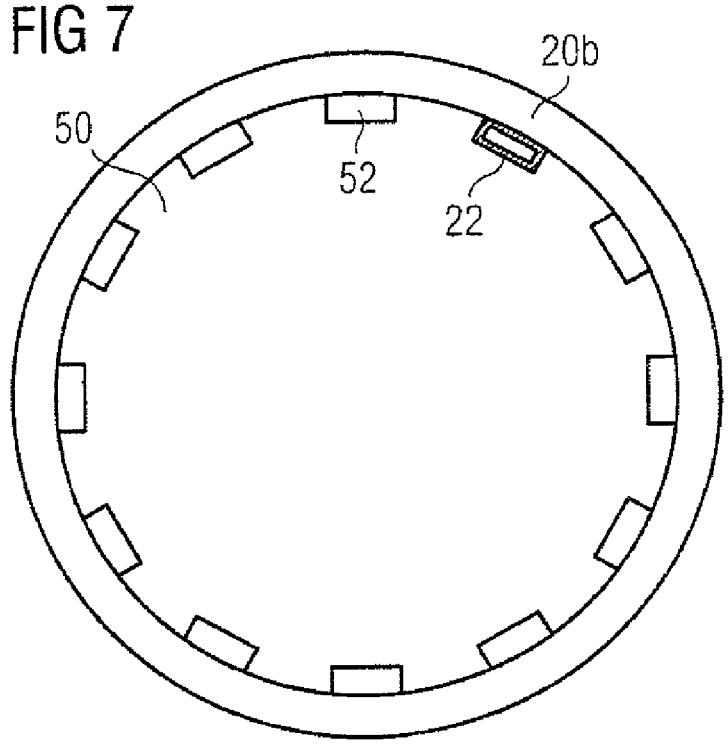
FIG. 7 shows an arrangement for assembling coils onto their support staves.

In variants of the method described in relation to FIGS. 8A-8D, the filler material 104 and the mold 100 may be arranged such that, rather than producing a complete reinforced-resin tube 102, a number of reinforced resin staves are produced, either on an outer or an inner surface of the coils 90, in an arrangement similar to that illustrated in FIG. 2 or FIG. 7.

While the present invention has been particularly described with reference to solenoidal magnet coils for systems such as nuclear magnetic resonance (NMR) or magnetic resonance imaging (MRI), it may be applied to the manufacture of solenoidal magnet coils, and to solenoidal magnet coils themselves for any application, particularly those in which precise coil alignment is required.

Although modifications and changes may be suggested by those skilled in the art, it is the intention of the inventors to embody within the patent warranted hereon all changes and modifications as reasonably and properly come within the scope of their contribution to the art.

We claim as our invention:

1. A solenoidal superconducting magnet structure comprising:
    a superconducting wire wound into coils having an outermost exterior;
    a mechanical support structure comprising a reinforced resin tube located over said outermost exterior of said coils, said coils and said mechanical support structure forming an assembly; and
    thermosetting resin in which an entirety of said assembly is monolithically embedded and forming, when said thermosetting resin sets a single solid article.

2. A solenoidal superconducting magnet structure as claimed in claim 1 comprising electrical leads connected to said coils and retained in said thermosetting resin.

3. A solenoidal superconducting magnet structure as claimed in claim 1 wherein said coils comprise a generally cylindrical inner set of coils surrounded by a generally cylindrical outer set of coils, and wherein said mechanical reinforced resin tube comprises a first support structure located over said inner set of coils and a second reinforced resin tube located over said second set of coils, and further support structure components mechanically joining said first and second reinforced resin tubes.

4. A solenoidal superconducting magnet structure as claimed in claim 1 comprising a plurality of superconducting wires respectively forming different coils with respectively different diameters, and comprising a filler layer disposed between said coils of respectively different diameters and said reinforced resin tube.

5. A solenoidal superconducting magnet structure as claimed in claim 4 wherein said filler layer comprises a layer of resin-impregnated cloth overwrap.

6. A solenoidal superconducting magnet structure as claimed in claim 1 comprising an end coil of said solenoidal superconducting magnet structure retained to said mechanical support structure by a filler layer adjacent to said end coil and bonded thereto by said resin, and a further filler layer over an external circumference of said end coil, bonded to said end coil by said resin.

7. A solenoidal superconducting magnet structure comprising:
    a mechanical support structure comprising a reinforced resin tube;
    at least one superconducting wire wound into a coil of said solenoidal superconducting magnet structure over said mechanical support structure, said mechanical support structure and said at least one coil forming an assembly; and
    thermosetting resin in which an entirety of said assembly is monolithically embedded and forming, when said thermosetting resin sets a single solid article.

8. A solenoidal superconducting magnet structure as claimed in claim 7 comprising electrical leads connected to said coils and retained in said thermosetting resin.

9. A solenoidal superconducting magnet structure as claimed in claim 7 comprising a plurality of wires respectively forming different coils with respectively different diameters, and comprising a filler layer disposed between said coils of respectively different diameters and said reinforced resin tube.

10. A solenoidal superconducting magnet structure as claimed in claim 9 wherein said filler layer comprises a layer of resin-impregnated cloth overwrap overlap.

11. A solenoidal superconducting magnet structure as claimed in claim 7 comprising an end coil of said solenoidal superconducting magnet structure retained to said mechanical support structure by a filler layer adjacent to said end coil and bonded thereto by said resin, and a further filler layer over an external circumference of said end coil, bonded to said end coil by said resin.

* * * * *